United States Patent [19]
Yamashita et al.
[11] 3,808,473
[45] Apr. 30, 1974

[54] MULTI-COMPONENT SEMICONDUCTOR DEVICE HAVING ISOLATED PRESSURE SENSITIVE REGION

[75] Inventors: Akio Yamashita, Ikeda; Masaru Tanaka, Toyonaka; Takehiro Tsuzaki, Osaka, all of Japan

[73] Assignee: Matsushita Electric Industrial Co., Ltd., Osaka, Japan

[22] Filed: Sept. 3, 1971

[21] Appl. No.: 177,862

Related U.S. Application Data

[63] Continuation of Ser. No. 786,249, Dec. 23, 1968, abandoned.

[30] Foreign Application Priority Data

Dec. 27, 1967 Japan .................................... 43-229

[52] U.S. Cl. ..... 317/235 R, 317/235 D, 317/235 M, 317/235 UA

[51] Int. Cl. ......................... H01l 11/00, H01l 15/00

[58] Field of Search .............. 317/235, 26, 31, 41.1, 317/22, 40.13

[56] References Cited

UNITED STATES PATENTS

| | | | |
|---|---|---|---|
| 3,397,450 | 8/1968 | Bittmann | 317/235 U |
| 3,443,041 | 5/1969 | Kahng et al. | 317/235 U |
| 3,444,444 | 5/1969 | Yamashita | 317/235 M |
| 3,461,324 | 8/1969 | Barry | 317/235 Y |
| 3,463,975 | 8/1969 | Biard | 317/235 U |
| 3,615,929 | 10/1971 | Portnoy | 317/235 U |
| 3,518,508 | 6/1970 | Yamashita | 317/235 M |

FOREIGN PATENTS OR APPLICATIONS

| | | | |
|---|---|---|---|
| 1,055,418 | 1/1967 | Great Britain | 317/235 M |

*Primary Examiner*—Andrew J. James
*Attorney, Agent, or Firm*—Stevens, Davis, Miller & Mosher

[57] ABSTRACT

A semiconductor device comprised by assembling a part having a mechano-electrical converting function comprising a metal-semiconductor contact provided in parallel or substantially parallel with a junction of a semiconductor body and a part of electrical circuit comprising such elements as a transistor, diode, resistor, inductor or capacitor into the semiconductor body.

6 Claims, 6 Drawing Figures

MULTI-COMPONENT SEMICONDUCTOR DEVICE HAVING ISOLATED PRESSURE SENSITIVE REGION

This is a continuation of application Ser. No. 786,249, filed Dec. 23, 1968, and now abandoned.

This invention relates to a semiconductor device and more particularly to a semiconductor device characterized in that a part having a mechano-electrical converting function comprising a metal-semiconductor contact provided in parallel or substantially parallel with a junction of a semiconductor body and an electrical circuit part comprising such elements as a transistor, diode, resistor, inductor or capacitor are assembled in the semiconductor body.

Hitherto, an integrated circuit is known in the art in which a transistor, diode, resistor, capacitor, etc. are provided in a semiconductor body, but all of them have as function to convert an electrical signal into an electrical signal. On the other hand, a solid state element having a mechano-electrical converting function is widely expected in recent years, and such a device has been investigated using a transistor or Esaki diode. But such device has a low sensitivity and cannot be used in practical use.

The object of the present invention is to eliminate such defects and to provide various novel semiconductor devices of small size having a mechano-electrical converting function. That is, a semiconductor device according to the present invention is characterized by a part having a mechano-electrical converting function comprising a metal-semiconductor contact provided in a semiconductor body in a parallel or substantially parallel with a junction of the semiconductor body.

The semiconductor device according to the present invention which is characterized by the part having the mechano-electrical converting function is comprised by assembling said portion and various electrical circuits into a semiconductor body, the size of which is small, can be used as an all solid state circuit in place of a circuit in which hitherto a mechanical contact switch is used together, and has such epoch-making features as that is light weighted does not chatter and has no arc deterioration.

Other objects, features and advantages will be readily apparent from the following detailed description in conjunction with the accompanying drawings, in which.

Figure 1:
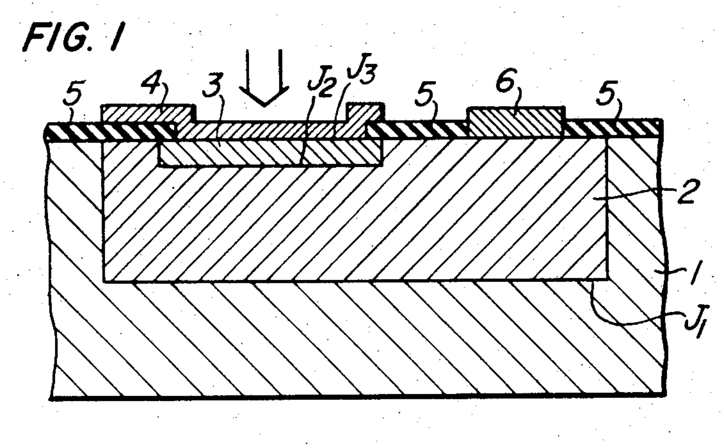
FIG. 1 is a cross-sectional view of an element having the mechano-electrical converting function used in a semiconductor device according to the present invention.

FIG. 1 is a diagram illustrating said mechano-electrical conversion functioning portion, wherein 1 indicates a semiconductor body, 2 a region including the mechano-electrical conversion functioning part separated from a portion of other electrical circuit parts in the semiconductor body 1, reference mark $J_1$ indicates a junction performing the separating action, 3 is a region separated by a junction $J_2$ into the region 2, 4 is a metal electrode making a rectifying contact with the semiconductor region 3 in parallel or substantially parallel with the junction $J_2$, 5 is an oxide film, 6 is a metal electrode making an ohmic contact with the semiconductor region 2, and $J_3$ indicates a junction between the metal electrode 4 and semiconductor region 3.

Figure 2:
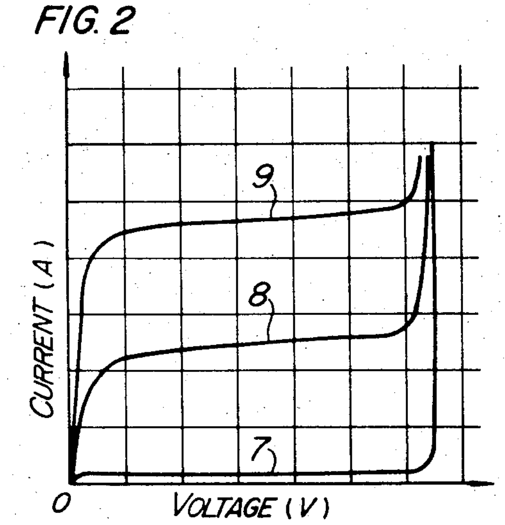
FIGS. 2 and 3 are graphs showing the current-voltage characteristics of the element shown in FIG. 1.
Figure 3:
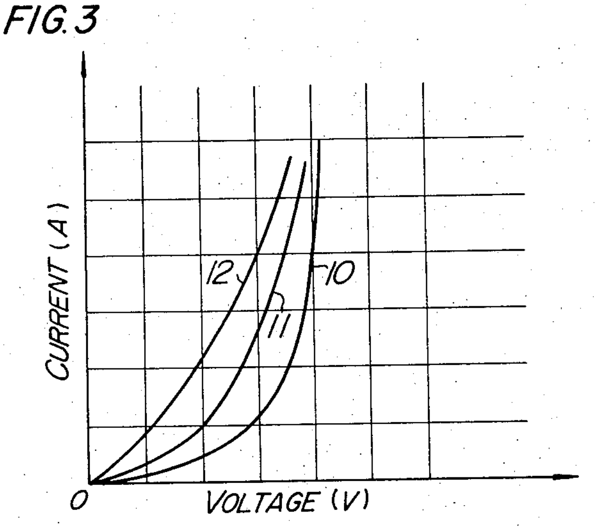

Now, when a stress is applied to the electrode 4 as indicated by an arrow applying a bias voltage between the metal electrodes 4 and 6, the electrical resistance between the metal electrodes 4 and 6 changes. The cause of which can be considered as follows that when the stress is applied to a space charge region between the junction $J_2$ and $J_3$ the produced electric current increases, then the hook effect is exerted to the junction $J_2$ or $J_3$ by means of the increased carrier and the electrical resistance changes considerably. The junction $J_2$ herein described means such well known junction as $p-n$, $n-n^+$, $p-p^+$, $n-i$ or $p-i$, and which are formed by means of an impurity having a shallow energy level or an impurity having a deep energy level. The fundamental characteristics of the mechano-electrical conversion functioning part are shown in FIGS. 2 and 3. Referring to FIG. 2 which shows the backward current-voltage characteristics, a curve 7 indicates a case where no stress is applied, and when a stress is applied the current increases with the applied stress as shown with curves 8 and 9. FIG. 3 shows the forward current-voltage characteristics, wherein a curve 10 shows a case where no stress is applied, and when a stress is applied the current increases with the applied stress as shown with curves 11 and 12.

The variation range of electrical resistance to a stress of the mechano-electrical conversion functioning part according to the present invention is large and reaches $10^3 - 10^5$. This feature cannot be provided with a conventional semiconductor transducer. Now, the assemblage of the mechano-electrical conversion functioning part and other parts of the electrical circuit are described.

Figure 4:
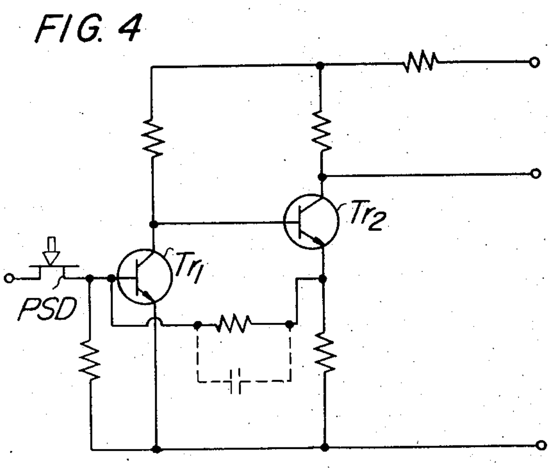
FIG. 4 is a circuit diagram of a device which assembled the element having the mechano-electrical converting function and ordinary electrical circuit parts.
Figure 5:
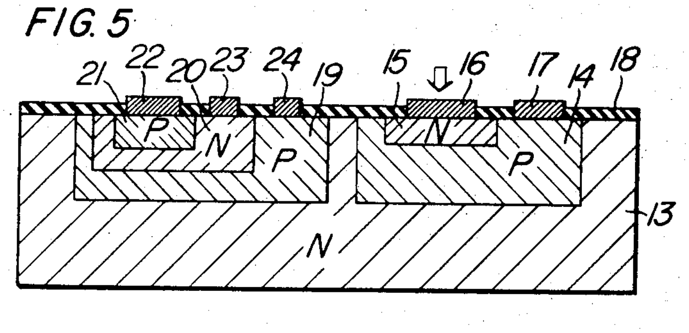
FIG. 5 is a cross-sectional view of an embodiment of a semiconductor device according to the present invention, which embodies the circuit diagram shown in FIG. 4.

FIG. 4 shows an example of such circuit, in which a mechanical signal is amplified by two-stage transistors. This circuit is used as various pressure controlling circuits. The circuit shown in FIG. 4 is constructed by said mechano-electrical conversion functioning portion PSD, transistors $Tr_1$ and $Tr_2$, resistors and a capacitor. An example of the semiconductor device according to the present invention is constituted by assembling this circuit into a semiconductor body. A cross-sectional view of one portion of the device is shown in FIG. 5, in which 13 is an N-type semiconductor body, 14 is a P-type region of the mechano-electrical conversion functioning part, 15 is an N-type region of that portion, and 16 is a metal electrode making a rectifying contact with the N-type region, on which a stress is applied. Numeral 17 is a metal electrode making an ohmic contact with the P-type region, 18 is an oxide film, 19 is a P-type region of a collector of a transistor, 20 is an N-type region of a base of the transistor, 21 is a P-type region of an emitter of the transistor, 22 is an emitter electrode, 23 is a base electrode, and 24 is a collector electrode. Another transistor is assembled in another place of the semiconductor body. The resistors can be metallic film resistors formed on the oxide film or can be formed into the semiconductor body. The conductivity types N and P shown in FIG. 5 are used only by way of explanation and these conductivity types can be reversed. As described above the N-P junction of the mechano-electrical conversion functioning part can be formed also in such construction as *n—n*$^+$, *p—p*$^+$, *n—i* or *p—i*. Furthermore, known impurities having a shallow energy level can be used to form the *n*—, *p*—, *n*$^+$—, *p*$^+$ or *i*-type region, but it is more effective to form the region by means of impurities having a deep energy level which have as effect to increase the sensitivity to a stress. This is caused by the fact that the life time of the carrier is reduced by the deep energy level. Here, such known impurities as P, Sb, As, B, Ga and In are used as the shallow energy level impurity and such impurities as Au, Cu, Co, Fe, No, Mn and Zn are usually used as the deep energy level impurity. Further, these regions are formed by means of a known diffusion method such as photoetching, passivation or vapor phase growth.

Now, an embodiment of the present invention is described in detail hereinbelow. Wherein, only the mechano-electrical conversion functioning part characterizing the present invention is described since in the semiconductor device according to the present invention the part of electrical circuit other than the mechano-electrical conversion functioning part is formed by known parts such as transistor, resistor, capacitor, inductor and SCR.

Figure 6:
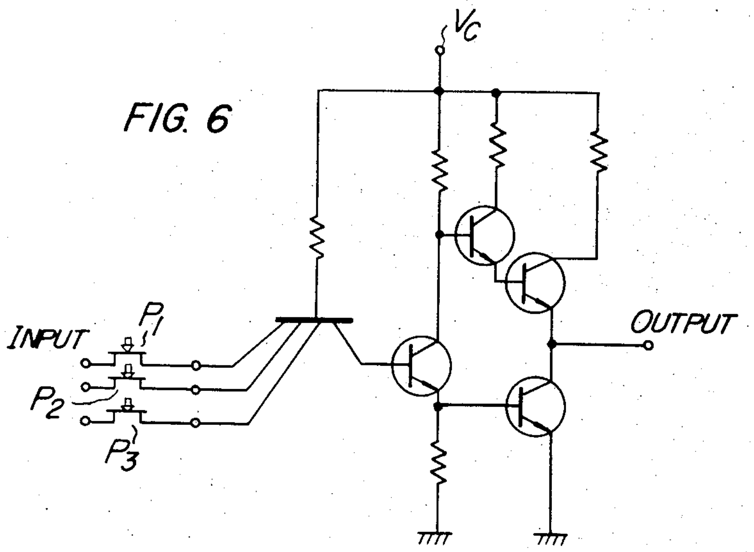
FIG. 6 is a circuit diagram of another device which can be assembled as a semiconductor device according to the present invention.

The embodiment is described with reference to FIG. 5, wherein B is diffused locally into the N-type semiconductor body using a mask of oxide film formed on the body, then a mask of the same oxide film is formed thereon and phosphor is diffused through the mask to form the N-type region. Here it is more effective to form the P-N junction as near as possible to the surface of the semiconductor body. On which Ag is deposited by the vacuum evaporation method as the metal which makes the rectifying contact with the N-type region 15. Also as the metal which makes the ohmic contact with the P-type region 14, Al is deposited by the vacuum evaporation method. In the embodiment of the semiconductor device according to the present invention thus formed, when a stress is applied onto the metal electrode 16 applying a DC bias between the electrodes 16 and 17 making the electrode 16 positive, a current flows between the base and emitter of the transistor $Tr_1$, thus a mechanical signal is converted into an electrical signal and is then amplified. Such a semiconductor device is used as an element of a controlling circuit of, for example, gas pressure, the amount of flow and temperature, and also can be used as a contactless switch. Another example of circuit is shown in FIG. 6, in which a TTL circuit used in a digital circuit is assembled with the mechano-electrical conversion functioning part, wherein the reference mark $P_1$, $P_2$ and $P_3$ indicate the mechano-electrical conversion functioning part. This circuit is used as software of an electronic computer and increases the calculating speed considerably. This circuit is also used in other measurement and communication devices.

What is claimed is:

1. In a semiconductor device having a semiconductor body of a first conductivity type, with a mechano-electrical transducer zone and components including transistors formed therein, the improvement in which said transducer zone comprises:

a first region of opposite conductivity type formed in said body;

a second region formed in said first region, said second region having a different property in conductivity from that of said first region to form a first substantial junction therebetween;

a metal electrode region formed on said second region to form a second junction therebetween, said second junction being positioned substantially in parallel with said first junction and forming a rectifying contact;

a stress impressing point adjacent the surface of the body at the surface of said metal electrode region for applying stress to the second rectifying junction;

another metal electrode region formed on said first region and separated from said second region and said metal region forming the rectifying contact to form an ohmic contact with the first region; and a third junction formed between said first region and said body for electrically isolating said zone from said components.

2. The semiconductor device according to claim 1, wherein said first junction is selected from the group consisting of *p—n*, *n—n*$^+$, *p—p*$^+$, *n—i* and *p—i*.

3. The semiconductor device according to claim 1, wherein said two metal electrodes are electrically isolated from each other through an oxide film existing on the surface of said semiconductor body.

4. The semiconductor device according to claim 1, wherein said first and second regions are doped with impurities having deep energy levels selected from the group consisting of Au, Cu, Co, Fe, Ni, Mn and Zn.

5. A semiconductor device comprising a semiconductor body of one conductivity type, a first region of opposite conductivity type formed in said body and forming a junction therewith, a second region formed in said first region, said second region providing a different property in conductivity from that of said first region to form a first substantial junction therebetween, a first metal electrode region formed on said second region to form a second junction therebetween, said second junction being positioned substantially in parallel with said first junction and forming a rectifying contact, a stress impressing point adjacent the surface of the body at the surface of said metal electrode region for applying stress to the second rectifying junction, a second metal electrode region formed on said first region and separated from said second region and said first metal region to form an ohmic contact with the first region, a fourth region formed in said semiconductor body and having substantially the same conductivity type as that of said first region, said fourth region being separated from said first region and electrically isolated therefrom through the junction between said first region and said body, a fifth region having opposite conductivity type to that of said fourth region and formed therein, a sixth region of the same conductivity type as that of said fourth region and formed in said fifth region, and said fourth, fifth and sixth regions having respective exposed metal electrodes separated from one another to form a transistor, said transistor being operative in accordance with a stress applied on said second metal electrode.

6. A mechano-electrical transducer, comprising:

a semiconductor body;

a first region formed in said semiconductor body and doped with impurities to produce a shallow energy level, said first region having a conductivity type different from that of said semiconductor body;

a first metal electrode formed on one surface of said semiconductor body in rectifying contact with said first region;

a second metal electrode formed on a second surface in ohmic contact with said semiconductor body;

means for applying mechanical stress to said first metal electrode, wherein the electrical resistance of said semiconductor body between said first and second metal electrode changes in relation to said applied stress;

a second region formed in said semiconductor body between said first region and the rest of said semiconductor body, said second region forming a junction with said first region which is in parallel with the junction between said first metal electrode and said first region;

wherein said second region forms a P-N junction with said semiconductor body and wherein said P-N junction comprises means for electrically separating said first region from further regions formed in said semiconductor body.

* * * * *